(12) United States Patent
Tono et al.

(10) Patent No.: US 8,703,402 B2
(45) Date of Patent: Apr. 22, 2014

(54) RESIST PATTERN FORMING METHOD AND DEVELOPER

(75) Inventors: Seiji Tono, Shunan (JP); Yuki Chikashige, Shunan (JP)

(73) Assignee: Tokuyama Corporation, Shunan-Shi (JP)

( * ) Notice: Subject to any disclaimer, the term of this patent is extended or adjusted under 35 U.S.C. 154(b) by 138 days.

(21) Appl. No.: 13/321,424

(22) PCT Filed: May 20, 2010

(86) PCT No.: PCT/JP2010/058939
§ 371 (c)(1),
(2), (4) Date: Jan. 17, 2012

(87) PCT Pub. No.: WO2010/134639
PCT Pub. Date: Nov. 25, 2010

(65) Prior Publication Data
US 2012/0107749 A1    May 3, 2012

(30) Foreign Application Priority Data

May 21, 2009  (JP) ................................. 2009-122707

(51) Int. Cl.
*G03F 7/26* (2006.01)
(52) U.S. Cl.
USPC .......................................... 430/322; 430/331
(58) Field of Classification Search
USPC ................................ 430/322, 311, 270.1, 331
See application file for complete search history.

(56) References Cited

U.S. PATENT DOCUMENTS

| | | | | |
|---|---|---|---|---|
| 5,837,425 | A * | 11/1998 | Nakanishi et al. ............ | 430/302 |
| 2002/0039703 | A1 | 4/2002 | Hotta et al. | |
| 2003/0211418 | A1 | 11/2003 | Kawauchi | |
| 2006/0127798 | A1 | 6/2006 | Ochiai et al. | |
| 2008/0008967 | A1 * | 1/2008 | Chang et al. .................. | 430/311 |

FOREIGN PATENT DOCUMENTS

| | | | |
|---|---|---|---|
| CN | 1453641 | A | 11/2003 |
| JP | 58-205149 | * | 11/1983 |
| JP | 02-221962 | A | 9/1990 |
| JP | 04-015232 | A | 1/1992 |
| JP | 07-142349 | * | 6/1995 |
| JP | 8-262738 | A | 10/1996 |
| JP | 2002-31887 | A | 1/2002 |
| JP | 2003-57820 | A | 2/2003 |
| JP | 2003-192649 | A | 7/2003 |
| JP | 2003-195518 | A | 7/2003 |
| JP | 2003-315985 | A | 11/2003 |
| JP | 2004-123586 | A | 4/2004 |
| JP | 3927575 | B2 | 6/2007 |
| WO | WO 2004/022513 | A | 3/2004 |

OTHER PUBLICATIONS

Nagasaki et al., "Novel Conformational Isomerism of Water-Soluble Calix[4]arenes" Tetrahedron. vol. 48, pp. 797-804, 1992.
International Preliminary Report on Patentability and Translation of Written Opinion of the International Searching Authority dated Dec. 22, 2011 for International Application No. PCT/JP2010/058939 (PCT/IB/338, PCT/IB/373 and PCT/ISA/237).
International Search Report issued in PCT/JP2010/058939 dated Jun. 22, 2010.
Chinese Office Action for Chinese Application No. 201080019592.1 dated Oct. 30, 2012.
Lee et al., "Acid-Sensitive Semiperfluoroalkyl Resorcinarene: An Imaging Material for Organic Electronics," J. Am Chem. Soc., 2008, No. 130, pp. 11564-11565.

\* cited by examiner

*Primary Examiner* — Caleen Sullivan
(74) *Attorney, Agent, or Firm* — Birch, Stewart, Kolasch & Birch, LLP

(57) ABSTRACT

There are provided a method of forming a resist pattern, comprising the steps of forming a resist film containing a specific calixarene derivative on a substrate; forming a pattern latent image by selectively exposing the resist film to a high-energy beam; and developing the latent image by removing parts not exposed to the high-energy beam of the resist film with a developer containing at least one fluorine-containing solvent selected form the group consisting of a fluorine-containing alkyl ether and a fluorine-containing alcohol, and the fluorine-containing solvent as a resist developer.

5 Claims, 1 Drawing Sheet

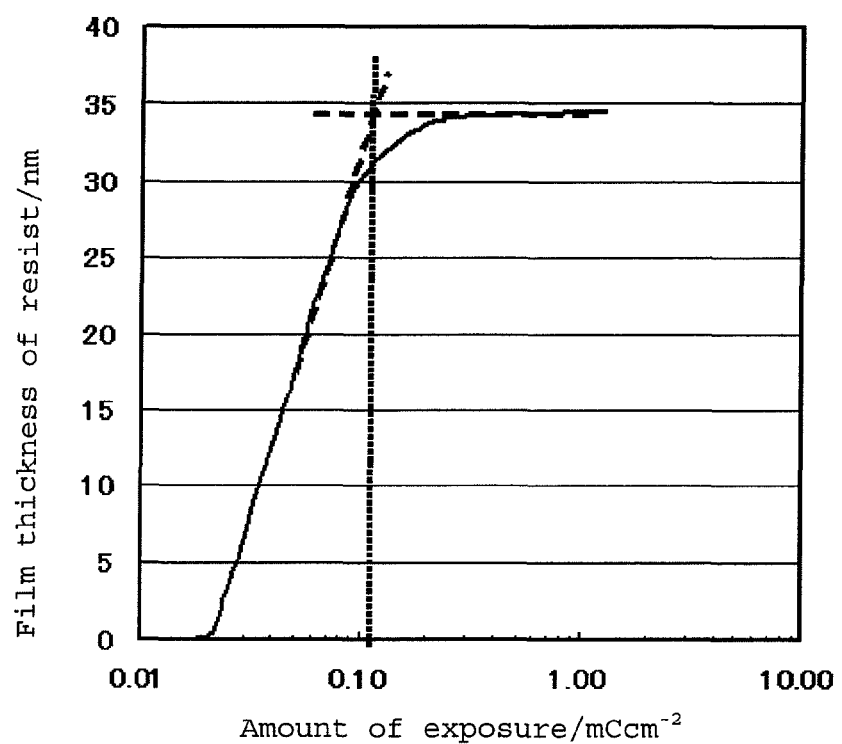

RESIST PATTERN FORMING METHOD AND DEVELOPER

TECHNICAL FIELD

The present invention relates to a method of forming a pattern or a photomask which is used to form a fine structure such as a semiconductor device or a semiconductor integrated circuit, or a high-energy beam resist pattern which is used for microfabrication related to the production of an imprint mold and to a developer for use in the method.

BACKGROUND ART

In the production process of a photomask having a pattern of an electronic circuit which is formed from a light blocking material on a semiconductor device such as a semiconductor integrated circuit (LSI) or a transparent substrate, or an imprint mold which is a heat or light imprint mold part, microfabrication is carried out by lithography using a photoresist. This is carried out by forming a photoresist thin film on a silicon substrate or a quartz glass substrate having a light blocking thin film thereon, selectively applying a high-energy beam such as an excimer laser beam, X-ray or electron beam to only part of the photoresist thin film so as to form a pattern latent image, developing it to obtain a resist pattern and etching the substrate by using the pattern as a mask.

Stated more specifically, in photolithography, an organic solvent solution of a photosensitive polymer material called "resist composition" is applied to a substrate having a layer to be processed on the surface and prebaked to evaporate the organic solvent so as to form a resist film. Then, the resist film is partially irradiated with light, and further unwanted parts of the resist film are dissolved and removed by using a developer to form a resist pattern on the substrate. Thereafter, the layer to be processed on the substrate having this resist pattern as a mask is dry etched or wet etched. Finally, unwanted parts are removed from the resist film to complete microfabrication.

In the production process of a photomask and an imprint mold, a pattern is formed by using an electron beam drawing apparatus or a laser drawing apparatus in most cases. As for a semiconductor device such as LSI to be formed on the silicon substrate, studies into the formation of a pattern using an electron beam drawing apparatus have been started for the further miniaturization of devices. Therefore, the development of a process using an electron beam resist is now actively under way. This electron beam resist is desired to have high etching resistance, high resolution and high sensitivity. Further, as pattern collapse readily occurs at the time of drying after development or rinsing along with the miniaturization of patterns, a process free from the occurrence of pattern collapse is desired.

Various types of organic resists which are sensitive to electron beams are known, and a resist pattern is formed by various methods. For example, there is proposed a method of forming a fine pattern by forming a thin film of a polymer of an ethylenically unsaturated monomer such as polymethyl methacrylate on a substrate as a resist film, irradiating it with an electron beam to form a predetermined image and developing the image with a low-molecular weight ketone such as acetone (refer to JP-A 8-262738). There is also proposed a method of forming a fine pattern by forming a thin film of a resist material containing a calixarene derivative as a resist film, irradiating it with an electron beam to form a predetermined image and developing the image with ethyl lactate, propylene glycol monomethyl ether or 2-heptanone (refer to WO2004/022513). There is further proposed a method of forming a fine pattern by forming a thin film of an electron beam resist material as a resist film, irradiating the film with an electron beam to form a predetermined image and developing the image with a supercritical fluid (refer to Japanese Patent No. 3927575).

Although a fine pattern can be formed according to the method of JP-A 8-262738, since the polymer of an ethylenically unsaturated monomer such as polymethyl methacrylate has low etching resistance, when the layer to be processed is etched deeply by using this resist as a mask, the aspect ratio of the resist pattern must be made large to increase the pattern height. Further, since the developer is a low-molecular weight ketone, the ignition point is low and an explosion-proof apparatus must be installed.

Meanwhile, since the resist material containing a calixarene derivative is used according to the method of WO2004/022513, though a pattern having high etching resistance and a width of 10 nm or less can be formed, this resist material has lower sensitivity than other resist materials and the amount of exposure must be made large. Therefore, there is room for improvement.

For example, FIG. 2 of the pamphlet of WO2004/022513 shows exposure characteristics (sensitivity curve) when the resist material is exposed to a 50 kV electron beam and developed with ethyl lactate or xylene. According to the exposure characteristics, the sensitivity of the resist used in the method of the above pamphlet is about 1 to 2 (mC/cm$^2$) and the sensitivity of a calix[4] arene-based resist having especially high resolution is about 2 (mC/cm$^2$). Higher sensitivity is required for the practical use of the resist. According to the pamphlet, the sensitivity of the resist is expressed by the minimum amount of exposure (mCcm$^{-2}$) which ensures that the film thickness of a resist pattern obtained after development becomes equal to the standard film thickness which is the film thickness of a resist before development (the thickness of a resist film after the resist is applied and prebaked as required).

According to the method of Japanese Patent No. 3927575, since the supercritical fluid having low surface tension is used at the time of development, it is possible to prevent pattern collapse at the time of drying after development or rinsing. However, an expensive apparatus is required and the throughput is low. Therefore, there is still room for improvement.

DISCLOSURE OF THE INVENTION

It is therefore an object of the present invention to provide a method capable of forming a pattern at a high resolution with a small amount of exposure by using a material having high etching resistance and further forming a resist pattern without the occurrence of pattern collapse.

It is another object of the present invention to provide a developer capable of developing a resist pattern even from a resist exposed with a small amount of exposure without pattern collapse.

Other objects and advantages of the present invention will become apparent from the following description.

The inventors of the present invention have conducted intensive studies to attain the above objects and have found that the above objects can be attained by using and developing a resist material containing a specific calixarene derivative which is an electron beam resist having high etching resistance with a developer containing a specific fluorine-based solvent. Thus, the present invention has been accomplished based on this finding.

That is, according to the present invention, firstly, the above objects and advantages of the present invention are attained by a method of forming a resist pattern, comprising the steps of:

forming on a substrate a resist film comprising at least one calixarene derivative selected from the group consisting of a calixarene derivative 1 represented by the following formula (1) and a calixarene derivative 2 represented by the following formula (2):

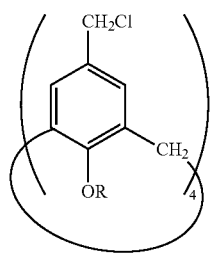
(1)

wherein R is an alkyl group having 1 to 10 carbon atoms

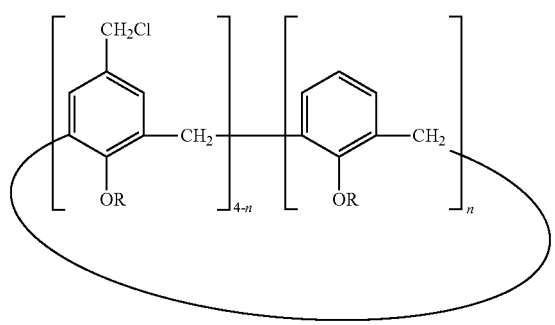
(2)

wherein R is an alkyl group having 1 to 10 carbon atoms and n is an integer of 1 to 3;

forming a latent image by selectively exposing part of the resist film to a high-energy beam; and developing the latent image by bringing the resist film having the latent image into contact with a developer containing at least one fluorine-containing solvent selected from the group consisting of a fluorine-containing alkyl ether and a fluorine-containing alcohol to remove parts not exposed to the high-energy beam of the resist film.

Secondly, the above objects and advantages of the present invention are attained by a resist developer containing at least one fluorine-containing solvent selected from the group consisting of a fluorine-containing alkyl ether and a fluorine-containing alcohol.

In the present invention, preferably, a fluorine-containing solvent having a boiling point at atmospheric pressure of 40° C. or higher is used.

In the present invention, preferably, the substrate obtained by the above latent image forming step is heated at a temperature of 80 to 130° C. before the development step and then developed with a developer containing the above fluorine-containing solvent.

In the present invention, preferably, even when the irradiation dose of the high-energy beam applied in the latent image forming step is 0.8 mC/cm² or less, a resist pattern without pattern collapse can be advantageously formed.

Further, in the present invention, the resist developer containing at least one fluorine-containing solvent selected from the group consisting of a fluorine-containing alkyl ether and a fluorine-containing alcohol is preferably a negative resist developer, more preferably a negative resist developer containing a calixarene derivative.

The above developer of the present invention is advantageously used to develop a negative resist having a latent image formed with an irradiation dose of the high-energy beam of 0.8 mC/cm² or less.

BRIEF DESCRIPTION OF THE DRAWINGS

FIG. 1 shows a sensitivity curve when the amount of exposure (or the irradiation dose) is plotted on the horizontal axis and the film thickness of a resist is plotted on the vertical axis.

BEST MODE FOR CARRYING OUT THE INVENTION

A detailed description is first given of each step of the resist pattern forming method of the present invention.
(Resist Film Forming Step)

In the present invention, a resist film comprising a calixarene derivative is first formed on a substrate by using a resist material containing at least one calixarene derivative selected from the group consisting of a calixarene derivative 1 represented by the following formula (1) and a calixarene derivative 2 represented by the following formula (2).

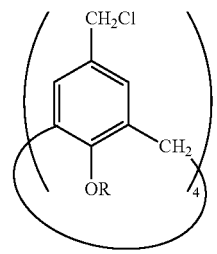
(1)

wherein R is an alkyl group having 1 to 10 carbon atoms.

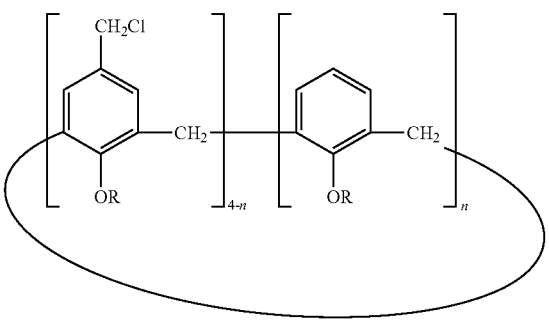
(2)

wherein R is as defined in the above formula (1), and n is an integer of 1 to 3.

A description is first given of this resist material.
(Resist Material)

In the present invention, a resist material containing at least one calixarene derivative selected from the group consisting of a calixarene derivative 1 represented by the above formula (1) and a calixarene derivative 2 represented by the above formula (2) is used. In the calixarene derivatives represented by the above formula (1) and the above formula (2), the substituent R is an alkyl group having 1 to 10 carbon atoms. The alkyl group may be linear or branched. Examples of the alkyl group include methyl group, ethyl group, n-propyl group, isopropyl group, isobutyl group, t-butyl group and hexyl group. Out of these, R is particularly preferably an alkyl group having 1 to 5 carbon atoms to enhance solubility in various solvents and facilitate the formation of a resist film.

In the calixarene derivative 2 represented by the above formula (2), n is an integer of 1 to 3. To increase the content of a chloromethyl group which is one of cross-link points in the molecule and enhance sensitivity, n is preferably 1 or 2, more preferably 1.

The calixarene derivatives 1 and 2 can be manufactured by methods described in WO2004/022513, "Nagasaki et al., Tetrahedron", vol. 48, pp. 797 to 804, 1992 and JP-A 2004-123586.

At least one calixarene derivative selected from the group consisting of calixarene derivatives represented by the above formula (1) and the above formula (2) may be one calixarene derivative or a mixture of two or more calixarene derivatives. Stated more specifically, the calixarene derivative 1 represented by the above formula (1) may be used alone, or a mixture of the calixarene derivatives 1 and 2 represented by the above formulas (1) and (2) may also be used. Especially when the productivity of a calixarene derivative itself and the formability of a resist film are taken into consideration, a mixture of calixarene derivatives 1 and 2 represented by the above formulas (1) and (2) is preferably used. This mixture has a mass ratio of the calixarene derivative 2 represented by the above formula (2) to the calixarene derivative 1 represented by the above formula (1), that is, a value obtained by dividing the mass of the calixarene derivative 2 represented by the above formula (2) by the mass of the calixarene derivative 1 represented by the above formula (1) (mass of the derivative of the above formula (2)/mass of the derivative of the above formula (1)) of preferably 0.0005 to 10, more preferably 0.0005 to 1.

In the following description, at least one calixarene derivative selected from the group consisting of calixarene derivatives 1 and 2 represented by the above formula (1) and the above formula (2) may be simply referred to as "calixarene derivative".

In the present invention, the resist material for forming a resist film on the substrate is preferably a solution prepared by dissolving the above calixarene derivative in an organic solvent such as ethyl lactate (EL), propylene glycol monomethyl ether (PGME), propylene glycol monomethyl ether acetate (PGMEA), ethyl propionate, n-butyl acetate or 2-heptanol. Known additives such as a surfactant may be contained in the resist material as required. The resist material is preferably prepared by dissolving all the components such as the calixarene derivative and optional additives in the above organic solvent and optionally filtering the resulting solution with a membrane filter. The content of the calixarene derivative in the resist material prepared as described above is suitably determined according to the desired thickness of the resist film and the type of the calixarene derivative. For example, it is preferably 0.1 to 10 mass-%.

(Method of Forming a Resist Film on the Substrate)

In the present invention, the substrate on which a resist film is to be formed is not particularly limited and known substrates such as silicon substrate, quartz glass substrate and these substrates having an oxide film, nitride film or metal thin film thereon may be used.

In the present invention, the above resist material is applied to the substrate by a known method such as spin coating and heated (baked) to form a resist film containing the above calixarene derivative. At this point, baking is preferably carried out on a hot plate or the like at a temperature of 80 to 130° C. The heating time is preferably 10 seconds to 5 minutes.

The thickness of the resist film formed by the above method is suitably determined according to use purpose but, for example, 5 to 300 nm, preferably 10 to 100 nm based on solid content.

The resist film containing the above calixarene derivative can be formed on the substrate by the above method. A description is subsequently given of the step of forming a pattern latent image by selectively exposing the resist film to a high-energy beam.

(Latent Image Forming Step)

In the present invention, part of the resist film on the substrate obtained by the above resist film forming step is selectively exposed to a high-energy beam so as to form a pattern latent image.

The above high-energy beam is not particularly limited if it is a light source capable of forming a latent image in the above resist film through the irradiation of the energy beam. Examples of the high-energy beam include electron beam, X-ray and ion beam.

The part to be exposed to the high-energy beam is suitably determined according to a pattern to be formed. Therefore, a known method may be employed as the method of selectively exposing to the high-energy beam. Examples of the method include a directly drawing method and a method of irradiating the high-energy beam through a mask.

A pattern latent image can be formed in the resist film by the above method. In the present invention, the substrate obtained by the above method, that is, the substrate on which the resist film containing the above calixarene derivative is formed and selectively exposed to the high-energy beam so as to form a pattern latent image (may be simply referred to as "substrate obtained by the latent image forming step" hereinafter) is then developed with a developer containing a specific fluorine-containing solvent which will be described in detail hereinafter. To form a pattern at a higher sensitivity at the time of development, preferably, the substrate obtained by the latent image forming step is heated (a heat treatment step is carried out) before development and then developed with a developer which will be described in detail hereinafter. A description is subsequently given of this heat treatment step.

(Heat Treatment Step)

In the present invention, the substrate obtained by the above latent image forming step is preferably heated on a hot plate or the like at a temperature of preferably 80 to 130° C., more preferably 90 to 120° C. (heat treatment step). By carrying out this heat treatment, a resist pattern after development can be formed with a small amount of exposure with the result of the sensitivity of the resist can be increased. For example, comparing sensitivity which is evaluated with the amount of exposure (D) defined in Examples which will be given hereinafter as an index, depending on the type of the developer, the amount of exposure (D) when a heat treatment is not carried out is 0.8 ($mC/cm^2$) or less, preferably 0.02 to 0.8 ($mC/cm^2$), more preferably 0.05 to 0.2 ($mC/cm^2$). On the other hand, when a heat treatment is carried out, the amount of exposure (D) can be set to 0.08 ($mC/cm^2$) or less, preferably 0.01 to 0.08 ($mC/cm^2$), more preferably more than 0.01 and 0.06 ($mC/cm^2$) or less.

The reason that the sensitivity of the resist is increased by carrying out this heat treatment is unknown but it is assumed as follows. That is, a radical generated in the resist by irradiating the high-energy beam reacts by the heat treatment to promote the crosslinking of the resist, whereby the solubility in the developer of the latent image portion degrades, or a partial hydrolytic reaction occurs by the heat treatment to modify the latent image portion, thereby reducing solubility in the developer, though the crosslinked state does not change. Since the crosslinking of the latent image portion becomes unsatisfactory when the amount of exposure is small, even when the latent image portion is developed with a developer containing a specific fluorine-containing solvent which will be described in detail hereinafter, the latent image portion easily dissolves and a reduction in the thickness of the film at the time of development cannot be avoided. However, when the heat treatment is carried out, the latent image portion hardly dissolves at the time of development due to the above mechanism, whereby the thickness of the resist pattern formed after development can be maintained at the same value as the thickness of the resist film before development.

The heating time is suitably determined according to temperature and the composition and film thickness of the resist film. For example, it is preferably 10 seconds to 5 minutes, particularly preferably 30 seconds to 5 minutes to develop a more excellent effect at the above temperature range. The substrate which has been heated by the above method may be simply referred to as "substrate obtained by the heat treatment step" hereinafter.

In the present invention, the substrate obtained by the latent image forming step or the substrate obtained by the above heat treatment step is developed with a developer containing a specific fluorine-containing solvent. This development step will be described hereinbelow.

(Development Step)

In the present invention, the substrate obtained by the above latent image forming step or the heat treatment step is brought into contact with a developer containing at least one fluorine-containing solvent selected from the group consisting of a fluorine-containing alkyl ether and a fluorine-containing alcohol to remove parts not exposed to the above high-energy beam of the resist film so as to develop the above latent image. The biggest features of the present invention are that this development step is carried out and that this developer is used. A description is first given of the developer containing the fluorine-containing solvent.

(Developer)

The developer used in the present invention contains at least one fluorine-containing solvent (may be simply referred to as "fluorine-containing solvent" hereinafter) selected from the group consisting of a fluorine-containing alkyl ether and a fluorine-containing alcohol. By using this developer, when a resist containing a calixarene derivative capable of forming a pattern having high etching resistance at a high resolution is used, a satisfactory pattern can be formed at a high sensitivity (with a small amount of exposure). That is, depending on the type of the developer, when the above heat treatment is not carried out, a satisfactory pattern can be formed by irradiating a high-energy beam such as an electron beam with a small amount of exposure, for example, 0.8 (mC/cm$^2$) or less, preferably 0.02 to 0.8 (mC/cm$^2$), more preferably 0.05 to 0.2 (mC/cm$^2$). When the above heat treatment is carried out, a satisfactory pattern can be formed even with a smaller amount of exposure, for example, 0.08 (mC/cm$^2$) or less, preferably 0.01 to 0.08 (mC/cm$^2$), more preferably more than 0.01 (mC/cm$^2$) and 0.06 (mC/cm$^2$) or less. When it is taken into consideration that the sensitivity of the calix[4] arene-based resist disclosed by WO2004/0022513 is about 2 (mC/cm$^2$) as described above, this amount of exposure is surprisingly small. When the substrate obtained by the latent image forming step using a resist containing a calixarene derivative is developed with this developer, a satisfactory pattern can be formed without the occurrence of pattern collapse.

Although the reason that the above effect is obtained by using the fluorine-containing solvent is not always known, this is considered to be due to the facts that the solubility for the above calixarene derivative of the fluorine-containing solvent is not too high and moderate and that the surface tension of the fluorine-containing solvent is low. That is, as for the increase of sensitivity, since the solubility for the above calixarene derivative of the fluorine-containing solvent is not too high and moderate, it is assumed that even when the molecular weight of a polymer (constituting a latent image portion) formed with a small amount of exposure is low, the polymer does not dissolve in the fluorine-containing solvent and only unexposed parts are selectively dissolved and removed at the time of development so that the latent image portion can remain while keeping its shape. As for the prevention of pattern collapse, it is assumed that when the fluorine-containing solvent is to be removed from the substrate after it dissolves the above calixarene derivative at the end of development or after rinsing, attraction force between patterns is weakened by the surface tension of the developer existent between the patterns due to low surface tension and that the pattern is swollen and not deformed by contact with another pattern due to moderate solubility.

Although the effect of increasing sensitivity and preventing pattern collapse at the time of development is especially marked for a resist containing a calixarene derivative (calixarene derivative 1 and/or 2), it is possible to control solubility for a resist material according to the type and amount of another solvent. Therefore, the same effect can be obtained for a negative resist other than the resist containing the above calixarene derivative, especially an electron beam negative resist. Consequently, the developer containing the fluorine-containing solvent is also useful as a developer for negative resists or a developer for electron beam negative resists. Examples of the resist material used for negative resists for which the developer containing the fluorine-containing solvent is useful include compounds which are crosslinked or polymerized through exposure (including the irradiation of an electron beam) so that their exposed parts become insoluble in the developer, specifically thiacalixarene derivatives, calixresorcinarene derivatives, adamantane derivatives and torquecene derivatives.

In the present invention, when handling ease is taken into consideration, out of the fluorine-containing solvents, a fluorine-containing solvent having a boiling point at atmospheric pressure of 40° C. or higher is preferred. When a fluorine-containing solvent having a boiling point within this range is used, the evaporation of the fluorine-containing solvent is rare, the composition of the developer rarely changes, and operation ease is improved more. The upper limit of the boiling point of the fluorine-containing solvent is preferably 150° C. when normal operation is taken into consideration. When a mixed solvent is used, the boiling points of the components of the solvent preferably fall within the above range. The fluorine-containing solvent preferably has a low coefficient of ozone destruction.

A description is subsequently given of the fluorine-containing solvent. Out of fluorine-containing solvents, the above fluorine-containing alkyl ether is preferably a hydrofluoroalkyl ether, particularly preferably a hydrofluoroalkyl ether represented by the following formula (3).

$$Rf\text{—}O\text{—}Rf' \qquad (3)$$

In the above formula, Rf and Rf' are each independently a hydrofluoroalkyl group represented by $C_aH_bF_c$ (a is an integer of 1 to 10, b is an integer of 0 to 10, c is an integer of 0 to 20, and b+c=2a+1).

Examples of the above compound include $CF_3CF_2CH_2OCHF_2$, $CF_3CHFCF_2OCH_3$, $CHF_2CF_2OCH_2CF_3$, $CF_3CH_2OCF_2CH_2F$, $CF_3CF_2CH_2OCH_2CHF_2$, $CF_3CHFCF_2OCH_2CF_3$, $CF_3CHFCF_2OCH_2CF_2CF_3$, $CF_3CHFCF_2CH_2OCHF_2$, $CF_3CHFCF_2OCH_2CHF_2$, $CH_3OCF_2CF_2CF_3$, $CH_3OCF_2CF(CF_3)_2$, $CF_3CH_2OCF_2CF_2CF_3$, $CH_3CH_2OCF_2CF(CF_3)_2$ and $CF_3CF_2CF(OCH_3)CF(CF_3)_2$.

In the present invention, the fluorine-containing alcohol is preferably a hydrofluoroalcohol, particularly preferably a hydrofluoroalkyl ether represented by the following formula (4).

$$Rf''\text{—OH} \qquad (4)$$

In the above formula, Rf'' is a hydrofluoroalkyl group represented by $C_dH_eF_f$ (d is an integer of 1 to 10, e is an integer of 0 to 10, f is an integer of 0 to 20, and e+f=2d+1). Specific examples of the above compound include $CF_3CH_2OH$, $CF_3CF_2CH_2OH$, $CF_3(CF_2)_2CH_2OH$, $CF_3(CF_2)_3CH_2OH$, $CF_3(CF_2)_4CH_2OH$, $CF_3(CF_2)_5CH_2OH$, $CF_3(CF_2)_6CH_2OH$, $CHF_2CF_2CH_2OH$, $CHF_2(CF_2)_3CH_2OH$ and $CHF_2(CF_2)_5CH_2OH$.

At least one fluorine-containing solvent selected from the group consisting of these fluorine-containing alkyl ethers and these fluorine-containing alcohols may be used alone or as a mixture of two or more fluorine-containing solvents.

Out of the above fluorine-containing solvents, a fluorine-containing solvent having a surface tension at 25° C. of preferably 5 to 20 mN/m, more preferably 10 to 20 mN/m is used. Out of these, a fluorine-containing solvent which can dissolve the above calixarene derivative in an amount of 0.01 to 50 ppm by weight at 23° C. is particularly preferably used.

The developer used in the present invention may be composed of only the above fluorine-containing solvent or a mixture of the above fluorine-containing solvent and another known solvent as long as the effect of the fluorine-containing solvent is not impaired. Example of the known solvent include hydrocarbon solvents, out of which alcohols and glycol ethers are particular preferred. When the ratio of the hydrocarbon solvent is too high, the effect of the above fluorine-containing solvent may degrade. Therefore, the mixing ratio of the hydrocarbon solvent is preferably 30 wt %, or less based on the total amount of the developer.

In the present invention, the substrate obtained by the above latent image forming step or the heat treatment step is developed by using this developer. A description is subsequently given of this development method.

(Development Method)

To develop the resist film by using the developer of the present invention, known methods may be employed. Stated more specifically, for example, a dipping method in which the substrate is immersed in a tank filled with the above developer, a puddle method in which the developer is placed on the surface of the substrate and a spray method in which the above developer is sprayed over the substrate are used. Out of these methods, the puddle method or the spray method is preferred so as to reduce the amount of particles which are the cause of contaminating the resist.

Describing the development method in more detail, the above developer having a temperature of preferably 10 to 35° C., more preferably 15 to 30° C. is applied to the substrate obtained by the latent image forming step or the heat treatment step and left to stand, or the developer having the above temperature range is kept spraying over the substrate for a predetermined time. The standing time and the time for spraying the developer are preferably 30 seconds to 10 minutes, more preferably 30 seconds to 5 minutes in consideration of throughput. A pattern can be fully formed at the above temperature range and the above time by using a combination of the above calixarene derivative and the above developer.

A fine resist pattern is formed by development in accordance with the above method, using a combination of the above calixarene derivative and the above developer.

(Post-Treatment)

The remaining developer can be removed from the substrate having the resist pattern formed by the above development with a rinsing liquid as required. Although an organic solvent used as the rinsing liquid may be the same or different from the above developer, it has a boiling point at atmospheric pressure of preferably 150° C. or lower, more preferably 120° C. or lower when drying ease is taken into consideration. The above development step and this rinsing step may be repeated 2 to 10 times alternately. After this rinsing step, the obtained substrate is turned at a high speed to drive off a chemical liquid such as the rinsing liquid so as to dry the substrate. Thereafter, a pattern can be formed on the substrate having the obtained resist pattern as a mask by etching, for example, dry etching the substrate.

EXAMPLES

The following examples and comparative examples are provided to further illustrate the present invention.

The present invention is not limited by these examples.

Examples 1 to 10 and Comparative Examples 1 to 6

Calixarene derivatives having a substituent R and mixing ratio shown in Tables 1 and 2 and propylene glycol monomethyl ether acetate (PGMEA) were mixed together and dissolved to ensure that the total content of the calixarene derivatives became 2 mass %. Then, the obtained solution was filtered with a high-density polyethylene (HDPE) membrane filter having a pore size of 0.05 μm to prepare a resist material. This resist material was applied to a 4-inch silicon wafer by spin coating and baked on a hot plate at 110° C. for 60 seconds to form a resist film having a thickness of 35 nm (as solid content) (resist film forming step).

Then, a latent image of a line-and-space pattern having a width of 200 μm for the evaluation of sensitivity and a latent image of a line-and-space pattern having a width of 20 nm for the evaluation of pattern collapse were drawn on the resist film formed on the silicon wafer by electron beam irradiation (latent image forming step). The electron beam irradiation was carried out with adjusting the irradiation dose of an electron beam (amount of exposure) by using the CAVL-9410NA electron beam drawing apparatus (of Krestek Co., Ltd.) at 50 kV of an acceleration voltage and at 100 pA of a beam current. Thereafter, the patterns were baked after exposure under the condition shown in Table 1 in Examples 3, 4, 6 and 9 (heat treatment step).

Then, each of the developers having composition shown in Tables 1 and 2 was applied to the substrate obtained by the above latent image forming step or the heat treatment step at 23° C. to carry out development for 60 seconds (development step).

After development, each of the rinsing liquids (same as the developer in composition) shown in Tables 1 and 2 was dropped on the substrate while the substrate was turned at 300 rpm for 30 seconds to rinse the substrate. In the end, the rinsing liquid was dried and removed at a revolution of 2,000 rpm to form a resist pattern.

The sensitivity and pattern collapse of the resist pattern obtained as described above were evaluated by the following methods.

(Sensitivity)

The film thickness of the above line-and-space pattern having a width of 200 μm was measured to plot the relationship between the amount of exposure (irradiation dose) and film thickness so as to draft a sensitivity curve. The exposure amount (D) of the electron beam was obtained from this sensitivity curve, and the sensitivity was evaluated based on the following criteria from this exposure amount (D) as an index for sensitivity.

◎: exposure amount (D) is 0.01 to 0.08 mC/cm$^2$
○: exposure amount (D) is more than 0.08 mC/cm$^2$ and 0.8 mC/cm$^2$ or less
Δ: exposure amount (D) is more than 0.8 mC/cm$^2$ and 1.5 mC/cm$^2$ or less
X: exposure amount (D) is more than 1.5 mC/cm$^2$ FIG. 1 shows the sensitivity curve of Example 1. This sensitivity curve was obtained by measuring the film thickness of an exposed part with a film thickness meter and plotting the amount of exposure on the horizontal axis and film thickness on the vertical axis. In Examples and Comparative Examples, sensitivity curves were drafted likewise to obtain the amount of exposure (D). Stated more specifically, as shown in FIG. 1, an intersection point between the approximate straight line (upward-sloping straight line shown by a dotted line in the figure) of a rising portion of the sensitivity curve and the approximate straight line (horizontal straight line shown by a dotted line in the figure) of a flat portion was obtained to take the amount of exposure (about 0.11 in FIG. 1) at that intersection point as the amount of exposure (D). The sensitivity was evaluated based on this amount of exposure (D) in Examples and Comparative Examples, and the results are shown in Tables 1 and 2.

(Pattern Collapse)

The obtained line-and-space pattern (1 to 1) having a width of 20 nm was observed through an electron microscope (magnification of 300,000×). A region having a length of 270 nm and a width of 420 nm observed under the above condition was divided into 16 sections (4×4), and the number of sections where the width between adjacent patterns was 10 nm or less was counted as pattern collapses and evaluated based on the following criteria.

○: no section having pattern collapse out of 16 sections
Δ: 1 to 3 sections having pattern collapse out of 16 sections
X: 4 or more sections having pattern collapse out of 16 sections The evaluation results are shown in Tables 1 and 2.

TABLE 1

| | | Calixarene derivatives | | Heat treatment step | Developer, rinsing liquid | | | |
|---|---|---|---|---|---|---|---|---|
| | | Mass ratio of | | Baking | | | | |
| Ex. | Group R* | derivative (2)/ derivative (1)** | Derivative (2) n*** | temperature and time | Composition of developer (mass % of each component) | Surface tension | Sensitivity | Pattern collapse |
| 1 | CH$_3$ | 0.001 | 1 | ○ | C$_4$F$_9$OC$_2$H$_5$ (100 mass %) | 14 mN/m | ○ | ○ |
| 2 | CH$_3$ | 0.001 | 1 | ○ | C$_4$F$_9$OC$_2$H$_5$ (95 mass %) isopropyl alcohol (5 mass %) | 14 mN/m | ○ | ○ |
| 3 | CH$_3$ | 0.001 | 1 | ◎ | C$_4$F$_9$OC$_2$H$_5$ (100 mass %) | 14 mN/m | ◎ | ○ |
| 4 | CH$_3$ | 0.001 | 1 | ◎ | C$_4$F$_9$OC$_2$H$_5$ (100 mass %) | 14 mN/m | ◎ | ○ |
| 5 | CH$_3$CH$_2$ | 0.05 | 2 | ○ | C$_4$F$_9$OC$_2$H$_5$ (95 mass %) C$_3$F$_6$(OCH$_3$)CF(CF$_3$)$_2$ (5 mass %) | 14 mN/m | ○ | ○ |
| 6 | CH$_3$CH$_2$CH$_2$ | 0.5 | 1 | ◎ | C$_2$F$_5$CH$_2$OH (100 mass %) | 19 mN/m | ◎ | ○ |
| 7 | CH$_3$CH$_2$CH$_2$ | 0.1 | 3 | ○ | C$_4$F$_9$OCH$_3$ (95 mass %) isopropyl alcohol (5 mass %) | 14 mN/m | ○ | ○ |
| 8 | CH(CH$_3$)$_2$ | 0.1 | 1 | ○ | C4F9OC2H5 (95 mass %) CHF$_2$CF$_2$CH$_2$OH (5 mass %) | 14 mN/m | ○ | ○ |
| 9 | CH(CH$_3$)$_2$ | 1 | 1 | ◎ | C$_2$F$_5$CH$_2$OCHF$_2$ (100 mass %) | 14 mN/m | ◎ | ○ |
| 10 | (CH$_2$)$_6$CH$_3$ | 3 | 1 | ○ | C$_4$F$_9$OC$_2$H$_5$ (100 mass %) | 14 mN/m | ○ | ○ |

*the same group for both calixarene derivative 1 represented by the formula (1) and calixarene derivative 2 represented by the formula (2)
**mass ratio of calixarene derivative 2 represented by the formula (2) to calixarene derivative 1 represented by the formula (1) (mass of calixarene derivative 2 represented by the formula (2)/mass of calixarene derivative 1 represented by the formula (1))
***integer n in calixarene derivative 2 represented by the formula (2)

TABLE 2

| | | Calixarene derivatives | | Heat treatment step | Developer, rinsing liquid | | | |
|---|---|---|---|---|---|---|---|---|
| | | Mass ratio of | | Baking | | | | |
| C. Ex. | Group R* | derivative (2)/ derivative (1)** | Derivative (2) n*** | temperature and time | Composition of developer (mass % of each component) | Surface tension | Sensitivity | Pattern collapse |
| 1 | CH$_3$ | 0.001 | 1 | None | isopropyl alcohol (100 mass %) | 21 mN/m | Δ | Δ |
| 2 | CH$_3$ | 0.001 | 1 | None | Xylene (100 mass %) | 29 mN/m | x | x |
| 3 | CH$_3$CH$_2$ | 0.05 | 2 | None | isopropyl alcohol (100 mass %) | 21 mN/m | Δ | Δ |

TABLE 2-continued

| C. Ex. | Group R* | Calixarene derivatives Mass ratio of derivative (2)/ derivative (1)** | Derivative (2) n*** | Heat treatment step Baking temperature and time | Developer, rinsing liquid Composition of developer (mass % of each component) | Surface tension | Sensitivity | Pattern collapse |
|---|---|---|---|---|---|---|---|---|
| 4 | $CH_3CH_2CH_2$ | 0.5 | 1 | None | Xylene (100 mass %) | 29 mN/m | x | x |
| 5 | $CH(CH_3)_2$ | 0.1 | 3 | None | Ethyl lactate (100 mass %) | 29 mN/m | Δ | x |
| 6 | $(CH_2)_6CH_3$ | 3 | 1 | None | Propylene glycol monomethyl ether acetate (100 mass %) | 27 mN/m | x | x |

*the same group for both calixarene derivative 1 represented by the formula (1) and calixarene derivative 2 represented by the formula (2)
**mass ratio of calixarene derivative 2 represented by the formula (2) to calixarene derivative 1 represented by the formula (1) (mass of calixarene derivative 2 represented by the formula (2)/mass of calixarene derivative 1 represented by the formula (1))
***integer n in calixarene derivative 2 represented by the formula (2)
C. Ex.: Comparative Example As obvious from the results shown in Tables 1 and 2, according to the method of forming a resist pattern of the present invention, a pattern having a good shape and free from pattern collapse can be formed with a small amount of exposure.

EFFECT OF THE INVENTION

According to the present invention, even when a resist containing a calixarene derivative which is a resist having high etching resistance is used, a pattern can be formed at a high resolution and a high sensitivity, and further a good pattern can be formed without the occurrence of pattern collapse.

The invention claimed is:

1. A method of forming a resist pattern, comprising the steps of:

forming on a substrate a resist film comprising at least one calixarene derivative selected from the group consisting of a calixarene derivative 1 represented by the following formula (1) and a calixarene derivative 2 represented by the following formula (2):

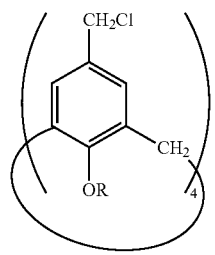

(1)

wherein R is an alkyl group having 1 to 10 carbon atoms

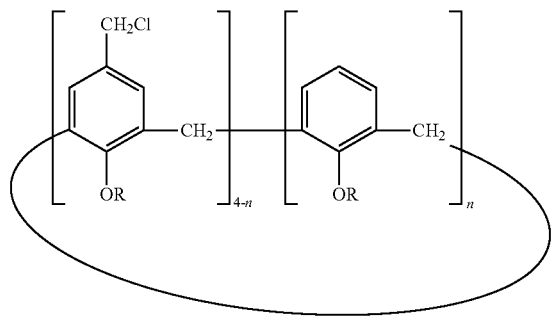

(2)

wherein R is an alkyl group having 1 to 10 carbon atoms and n is an integer of 1 to 3;

forming a latent image by selectively exposing part of the resist film to a high-energy beam; and developing the latent image by bringing the resist film having the latent image into contact with a developer, which developer comprises a mixture of at least one fluorine-containing solvent and another solvent to remove parts not exposed to the high-energy beam of the resist film, said at least one fluorine-containing solvent being selected from the group consisting of a fluorine-containing alkyl ether and a fluorine-containing alcohol and said another solvent being selected from the group consisting of an alcohol and a glycol ether in an amount of 30 wt % or less based on the total amount of the developer.

2. The method of forming a resist pattern according to claim 1, wherein the fluorine-containing solvent has a boiling point at atmospheric pressure of 40° C. or higher.

3. The method of forming a resist pattern according to claim 1 or 2, wherein the substrate obtained by the latent image forming step is subjected to a heating step in which the substrate is heated at a temperature of 80 to 130° C. before the development step.

4. The method according to claim 1, wherein the irradiation dose of the high-energy beam applied in the latent image forming step is 0.8 mC/cm² or less.

5. The method according to claim 1, said at least one fluorine-containing solvent being present in an amount of 70 wt % or more, and said another solvent being present in an amount of 30 wt % or less, based on the total amount of the developer.

* * * * *